(12) United States Patent
Olmos et al.

(10) Patent No.: US 8,330,502 B2
(45) Date of Patent: Dec. 11, 2012

(54) SYSTEMS AND METHODS FOR DETECTING INTERFERENCE IN AN INTEGRATED CIRCUIT

(75) Inventors: Alfredo Olmos, Austin, TX (US);
Ricardo Maltione, Campinas (BR);
Eduardo Ribeiro da Silva, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 63 days.

(21) Appl. No.: 12/625,982

(22) Filed: Nov. 25, 2009

(65) Prior Publication Data
US 2011/0121865 A1     May 26, 2011

(51) Int. Cl.
*H03K 5/22* (2006.01)
*H03K 5/153* (2006.01)

(52) U.S. Cl. .............. 327/80; 327/81; 327/82

(58) Field of Classification Search .......... 327/80, 327/81, 82
See application file for complete search history.

(56) References Cited

U.S. PATENT DOCUMENTS

| | | | |
|---|---|---|---|
| 4,099,255 | A | 7/1978 | Stanley et al. |
| 5,073,853 | A | 12/1991 | Johnson |
| 5,155,729 | A | 10/1992 | Rysko et al. |
| 5,233,613 | A | 8/1993 | Allen et al. |
| 5,398,332 | A | 3/1995 | Komoda et al. |
| 5,528,756 | A | 6/1996 | Molnar |
| 5,740,360 | A | 4/1998 | Huckstepp |
| 6,393,589 | B1 | 5/2002 | Smit et al. |
| 6,961,866 | B2 | 11/2005 | Janin et al. |
| 7,088,964 | B2 | 8/2006 | O |
| 2002/0180497 | A1 | 12/2002 | Kim |
| 2004/0093531 | A1 | 5/2004 | Espinor et al. |
| 2006/0062070 | A1 | 3/2006 | Sibigtroth et al. |
| 2008/0030357 | A1 | 2/2008 | Lueck et al. |
| 2008/0079444 | A1* | 4/2008 | Denison .............. 324/679 |
| 2009/0295412 | A1* | 12/2009 | Griffin ............... 324/681 |

OTHER PUBLICATIONS

Khan, M.Z., et al., Detection of Upset Induced Execution Errors in Microprocessors, Proc. 8th Annual Int. Phoenix Conf. on Computers and Communications, Mar. 22-24, 1989, pp. 82-86.
Baffreau, S., et al., Characterization of Microcontroller Susceptibility to Radio Frequency Interference, IEEE Proc. 4th Int. Caracas Conf. on Devices, Circuits and Systems, Apr. 17-19, 2002, pp. 1031-1-1031-5.
Campbell, D., AN1263 Designing for Electromagnetic Compatibility with Single-Chip Microcontrollers, Freescale,2004.
AN1015 Software Techniques for Improving Micorcontroller ER EMC Performance' STMicroelectronics, 2001.
Su, T, et al., New Test Method for the Pulse Immunity of Microcontrollers, IEEE, 1-4244-1350-Aug. 2007.
Sicard, E., Electromagnetic Compatibility of IC's. Advances and Issues, Past, Present and Future, IEEE, INSA, Dec. 7, 2006.
Sicard, E., et al., Towards an EMC roadmap for Integrated Circuits, IEEE, Sep. 25, 2007.
Alaeldine, A., et al., Efficiency of Embedded On-Chip EMI Protections to Continuous Harmonic and Fast Transient Pulses with respect to Substrate Injection, 1-4244-1350, IEEE, Aug. 2007.

* cited by examiner

*Primary Examiner* — John Poos
(74) *Attorney, Agent, or Firm* — Ingrassia Fisher & Lorenz, P.C.

(57) ABSTRACT

Apparatus, systems and methods are provided for protecting a processing system from electromagnetic interference. An integrated circuit comprises a sensing arrangement configured to sense an interference signal and an interference detection module coupled to the sensing arrangement. The interference detection module is configured to detect when a power level associated with the interference signal is greater than a threshold value. In one embodiment, the interference detection module generates an interrupt for a processing system when the power level associated with the interference signal is greater than the threshold value.

19 Claims, 6 Drawing Sheets

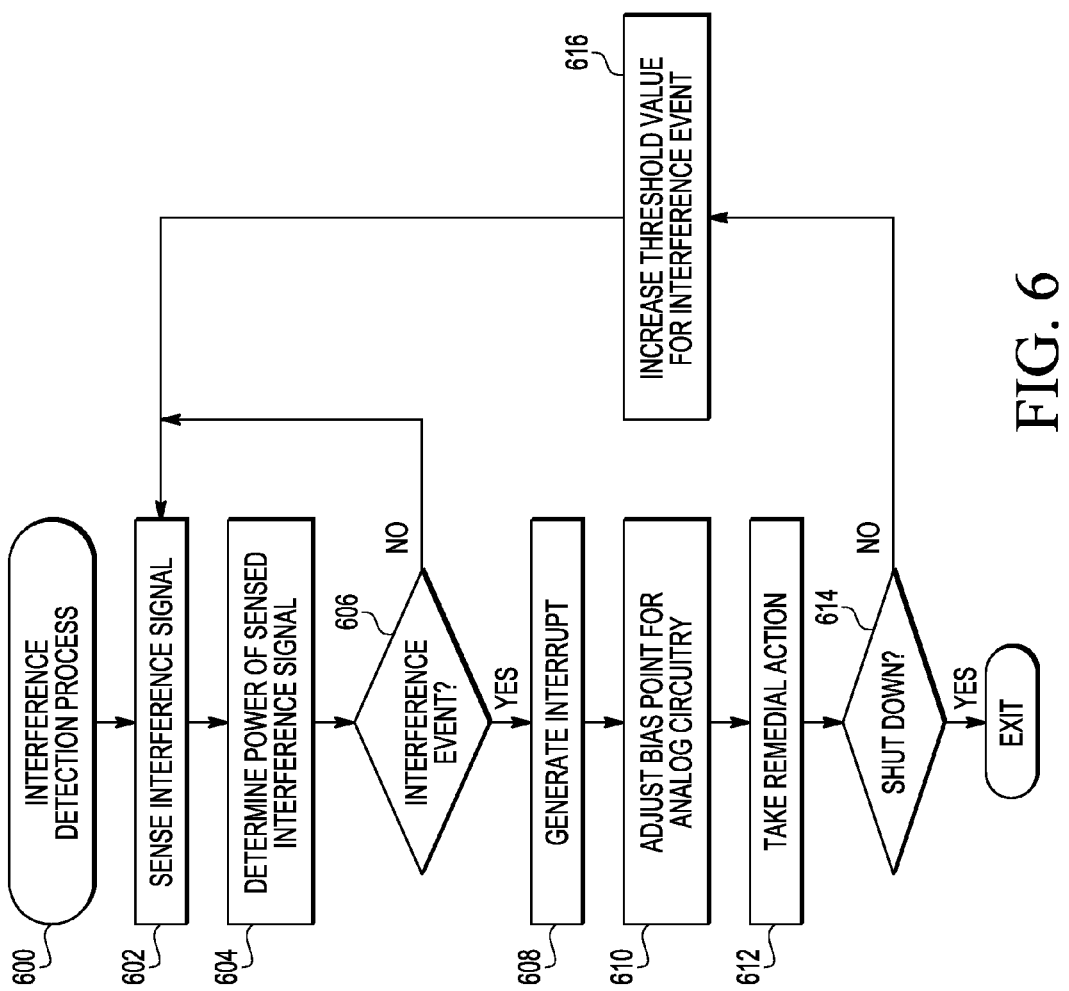

SYSTEMS AND METHODS FOR DETECTING INTERFERENCE IN AN INTEGRATED CIRCUIT

TECHNICAL FIELD

Embodiments of the subject matter described herein relate generally to electronic circuits, and more particularly, embodiments of the subject matter relate to detecting electromagnetic interference in electronic circuits.

BACKGROUND

Electromagnetic interference degrades performance of electronic devices and electrical circuits. For example, electromagnetic interference may produce noise, distortion, or otherwise corrupt an electrical signal of interest or otherwise have undesirable effects on the operation of a particular device. In some cases, electromagnetic interference prevents an electronic component from performing its intended function. Integrated circuits are increasingly susceptible to electromagnetic interference as the clock frequencies increase and supply voltages decrease. The increased susceptibility to electromagnetic interference limits the utility of such integrated circuits (or the electronic devices containing the integrated circuits) in some environments. Some prior art solutions utilize watchdog timers or software techniques to protect components of an integrated circuit from electromagnetic interference, however, these systems are limited by their response time, risking loss of data, control or otherwise allowing operation of the integrated circuit to be compromised.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 6 is a flow diagram of an interference detection process suitable for use with the interference protection system of FIG. 1 in accordance with one embodiment of the invention.

DETAILED DESCRIPTION

Figure 1:
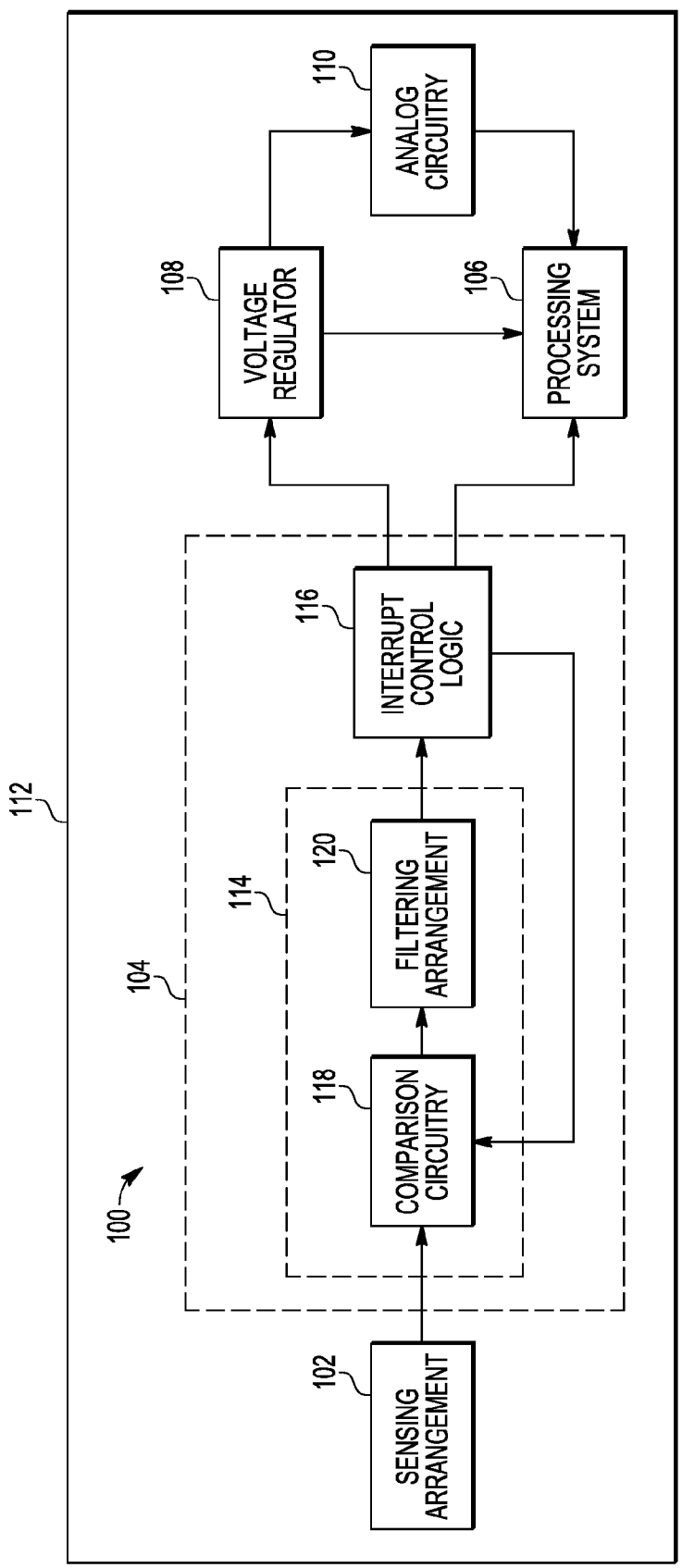
FIG. 1 is a block diagram of an interference protection system in accordance with one embodiment of the invention.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

The following description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter. As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

For the sake of brevity, conventional techniques related to electromagnetic conduction, electromagnetic radiation, antennas and/or antenna design, sensing, signaling, biasing, integrated circuit design and/or layout, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used in the following description for the purpose of reference only, and thus are not intended to be limiting, and the terms "first", "second" and other such numerical terms referring to structures do not imply a sequence or order unless clearly indicated by the context.

Technologies and concepts discussed herein relate to systems and/or methods for protecting internal components of an integrated circuit from electromagnetic interference. It will be appreciated that in some practical embodiments, the subject matter described herein may be utilized with radio frequency (RF) interference, however, the subject matter is not intended to limited to radio frequencies, and in fact, may be adapted for electromagnetic interference (conducted or radiated) having any frequency (or range thereof). As described in greater detail below, in an exemplary embodiment, one or more sensing arrangements are provided within the integrated circuit for sensing an electromagnetic interference signal. When a power level of the sensed interference signal is greater than a threshold value, an interrupt signal is generated for the processing system within the integrated circuit. In response to the interrupt signal, the processing system may take remedial actions, such as, for example, storing any unsaved data and/or volatile memory or safely shutting down. Additionally, the biasing (or bias point) of analog circuitry within the integrated circuit, such as voltage references (e.g., a bandgap voltage reference or another suitable voltage reference), current references (e.g., a PTAT current reference, a CTAT current reference, or a ZTC current reference), voltage regulators, oscillators and/or phase-locked loops (PLLs), or the like, may be increased, thereby allowing the analog circuitry to function normally in the presence of electromagnetic interference.

FIG. 1 depicts an exemplary embodiment of an interference protection system 100 suitable for use within an integrated circuit 112 in an electronic device. In an exemplary embodiment, the interference protection system 100 includes, without limitation, a sensing arrangement 102, an interference detection module 104, a processing system 106, a voltage regulator 108, and analog circuitry 110. In an exemplary embodiment, the interference protection system 100 is realized as a system-on-a-chip (SOC), such that the sensing arrangement 102, the interference detection module 104, the processing system 106, the voltage regulator 108, and the analog circuitry 110 are integrally formed and packaged into a single integrated circuit 112. In this regard, the sensing arrangement 102, the interference detection module 104, the processing system 106, the voltage regulator 108, and the analog circuitry 110 are each formed on, mounted on or otherwise supported by a common semiconductor substrate and encapsulated in a single device package, as will be appreciated in the art and described in greater detail below.

It should be understood that FIG. 1 is a simplified representation of an interference protection system 100 for purposes of representation and ease of explanation and is not intended to limit the subject matter described herein in any way. In this regard, in alternative embodiments, the sensing arrangement 102, the interference detection module 104, the processing system 106, the voltage regulator 108, and the analog circuitry 110 may each be realized as a separate integrated circuits or modules within an electronic device. It will be appreciated that practical embodiments of the interference protection system 100 may include additional components and/or elements configured to perform additional functionality not described herein. Also, it should be appreciated that although FIG. 1 depicts the interrupt control logic 116 as part of the interference detection module 104, alternative embodiments may implement the features and/or functionality of the interrupt control logic 116 as part of the processing system 106.

In an exemplary embodiment, the sensing arrangement 102 is configured to sense or otherwise obtain an electromagnetic interference signal within the integrated circuit 112 resulting from conducted and/or radiated electromagnetic interference from an external source outside the integrated circuit 112. The interference detection module 104 is configured to detect an electromagnetic interference event, that is, when a power level (or another suitable power metric) associated with an electromagnetic interference signal sensed by the sensing arrangement 102 is greater than a threshold value for a predetermined amount of time, and generate an interrupt signal in response to an electromagnetic interference event, as described in greater detail below. In this regard, the threshold value and/or predetermined amount of time may be chosen for compatibility with applicable electromagnetic interference standards, as will be appreciated in the art. The processing system 106 is coupled to the output of the interference detection module 104 and the processing system 106 is configured to perform one or more remedial actions in response to the interrupt signal, as described in greater detail below.

In an exemplary embodiment, the interference detection module 104 is coupled to the voltage regulator 108. The voltage regulator 108 generally represents the hardware, firmware and/or software configured to regulate the supply voltage for the processing system 106 and/or analog circuitry 110. Additionally, in an exemplary embodiment, the voltage regulator 108 is configured to control the biasing (e.g., the bias point or operating point) of the analog circuitry 110. In an exemplary embodiment, the interference detection module 104 and the voltage regulator 108 are cooperatively configured to adjust the bias point for the analog circuitry 110 by increasing the bias point in response to an electromagnetic interference event, as described in greater detail below.

As described in greater detail below, the sensing arrangement 102 comprises a sensing element sensitive to electromagnetic interference (e.g., sensitive to electromagnetic fields) that is capacitively coupled to the interference detection module 104 to provide an interference signal indicative of the electromagnetic interference to the interference detection module 104. It should be noted that although FIG. 1 depicts a single sensing arrangement 102, in practice, a plurality of sensing arrangements will likely be present. In this regard, each sensing element is capable of sensing electromagnetic interference over a particular bandwidth about a particular resonant frequency, as described in greater detail below. In this regard, a sensing element of the sensing arrangement 102 may be tuned for a particular frequency of interest (or a range of frequencies), that is, a frequency that the processing system 106 and/or analog circuitry 110 is particularly susceptible to or otherwise known to be a source of electromagnetic interference events. Depending on the embodiment, as described in greater detail below, the sensing arrangement 102 may be configured to sense radiated and/or conducted interference signals carried by the unregulated power supply of the integrated circuit 112, radiated interference signals from the substrate of the integrated circuit 112, radiated interference signals from the leadframe pad of the integrated circuit 112, and/or conducted interference signals from other components and/or locations within the integrated circuit 112, such as, for example, one or more input/output (I/O) pins of the integrated circuit 112.

In an exemplary embodiment, the interference detection module 104 comprises interference detection circuitry 114 and interrupt control logic 116. The interference detection circuitry 114 is coupled to the output of the sensing arrangement 102, and the interference detection circuitry 114 is configured to determine whether a power level of an interference signal sensed by the sensing arrangement 102 is greater than a threshold value. In an exemplary embodiment, the interference detection circuitry 114 is configured to determine the average power of a sensed interference signal by rectifying and/or demodulating the sensed interference signal from the sensing arrangement 102. In an exemplary embodiment, the interference detection circuitry 114 includes comparison circuitry 118 comprising a comparator or other suitably configured circuitry which compares the average power of the sensed interference signal to a threshold value to detect or otherwise determine when the average power of the sensed interference signal exceeds the threshold value. In an exemplary embodiment, the interference detection circuitry 114 also includes a filtering arrangement 120 that comprises deglitchers or other suitably configured filters at the output of the comparison circuitry 118 to discriminate or filter out spurious noise or brief spikes in electromagnetic interference which would have negligible adverse impact on the interference protection system 100 and/or processing system 106 due to their short duration. In this regard, the filters and/or deglitchers of the filtering arrangement 120 are configured such that the output of the comparison circuitry 118 when the sensed interference signal exceeds the threshold value for less than a predetermined amount of time is filtered and the output of the interference detection circuitry 114 remains logical low (or logical '0'). The predetermined amount of time represents the amount of time which the power level of an interference signal may exceed the threshold value before there is a need for remedial measures due to a likelihood of the electromagnetic interference adversely affecting the processing system 106 and/or interference protection system 100. Thus, the output of the interference detection circuitry 114 is a logical high (or logical '1') when the power level of a sensed interference signal is greater than a threshold value for a predetermined amount of time, thereby indicating the existence of an electromagnetic interference event.

The interrupt control logic 116 is coupled to the output of the interference detection circuitry 114 (e.g., comparator(s) and/or deglitcher(s)) and is configured to generate an interrupt signal or otherwise indicate the occurrence of an electromagnetic interference event to the processing system 106 and/or voltage regulator 108. In this regard, the interrupt signal comprises a digital signal or code, wherein one or more bits of the digital signal identify the interrupt signal as an interrupt signal attributable to an electromagnetic interference event. In accordance with one or more embodiments, the interrupt control logic 116 is configured to adjust the threshold value(s) used by the comparison circuitry 118 during operation of the interference protection system 100, as described in greater detail below.

The processing system 106 generally represents the main processing core(s) or central processing unit(s) (CPU) for the interference protection system 100. In this regard, the processing system 106 executes applications and/or programs for the interference protection system 100 and interacts with other elements of the interference protection system 100 in a conventional manner, as will be appreciated in the art. In an exemplary embodiment, the processing system 106 is implemented or realized as microcontroller or digital signal processor (DSP) comprising a plurality of processing cores, however, in alternative embodiments, the processing system 106 may be realized with a general purpose processor, a microprocessor, a content addressable memory, a digital signal processor, an application specific integrated circuit, a field programmable gate array, any suitable programmable logic device, discrete gate or transistor logic, discrete hardware components, or any combination thereof, designed to support and/or perform the functions described herein. In an exemplary embodiment, the processing system 106 includes or otherwise interfaces with a suitable amount of non-volatile memory to support operation of the interference protection system 100 as described in greater detail below.

The analog circuitry 110 generally represents the analog components or analog blocks of the interference protection system 100 which interface with the processing system 106. For example, in an exemplary embodiment, the analog circuitry 110 comprises an oscillator and/or phase-locked loop (PLL) which is configured to provide a clock signal to the processing system 106. In other embodiments, the analog circuitry 110 comprises analog-to-digital converters (ADCs), digital-to-analog converters (DACs), analog comparators, low voltage detectors or inhibitors, temperature detectors, and the like. In an exemplary embodiment, the analog circuitry 110 has a bias point (e.g., a bias current or bias voltage) that controls one or more operating characteristics of the analog circuitry 110.

In an exemplary embodiment, the voltage regulator 108 is configured to adjust the bias point of the analog circuitry 110 in response to an electromagnetic interference event. In accordance with one embodiment, the voltage regulator 108 includes a reference current arrangement (or reference current source) which is configured to set the bias point (or operating point) of the analog circuitry 110. For example, the bias current for an oscillator and/or PLL may be based on the reference current provided by the reference current arrangement of the voltage regulator 108. In an exemplary embodiment, in response to an electromagnetic interference event, the voltage regulator 108 is configured to adjust the bias point of the analog circuitry 110, for example, by increasing the value of the reference current of the reference current arrangement, thereby increasing the bias current of the analog circuitry 110 by a proportional amount, as described in greater detail below. In alternative embodiments, the analog circuitry 110 may have a voltage bias, wherein the voltage regulator 108 may increase the bias voltage for the analog circuitry 110, as will be appreciated in the art.

Figure 2:
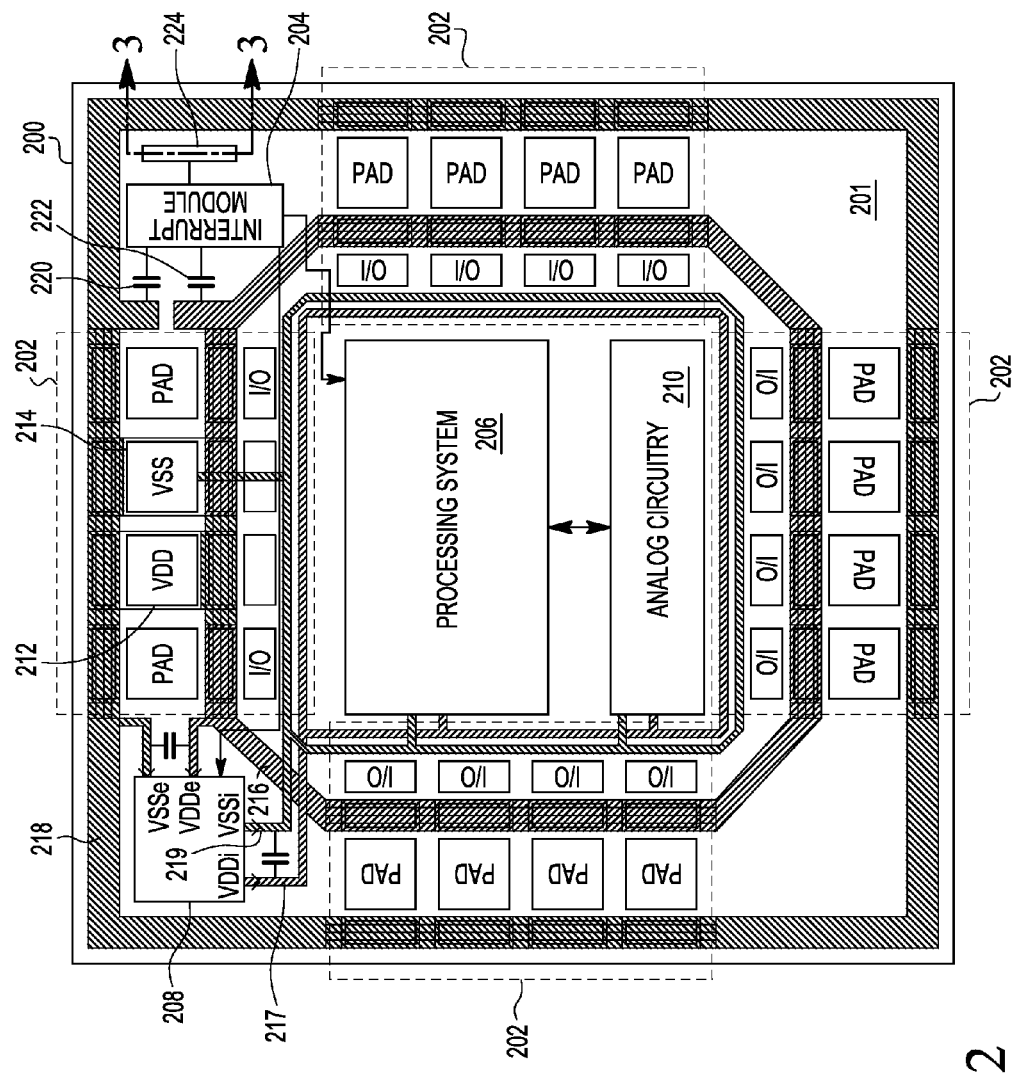
FIG. 2 is a block diagram of an integrated circuit suitable for use with the interference protection system of FIG. 1 in accordance with one embodiment of the invention.

FIG. 2 depicts a top view of an exemplary embodiment of an integrated circuit 200 suitable for use with the interference protection system 100 of FIG. 1. The integrated circuit 200 includes, without limitation, a plurality of input/output (I/O) pins 202, an interference detection module 204, a processing system 206, and a voltage regulator 208 which are formed on or otherwise supported by a semiconductor substrate 201. Various elements of the integrated circuit 200 are similar to counterpart elements of the interference protection system 100 described above in the context of FIG. 1, and accordingly, will not be redundantly described here in the context of FIG. 2. Furthermore, it should be understood that FIG. 2 is a simplified representation of the integrated circuit 200 for purposes of representation and ease of explanation and is not intended to limit the subject matter described herein in any way.

As shown in FIG. 2, in an exemplary embodiment, the integrated circuit 200 includes a plurality of I/O pins 202 for interfacing with external systems, components and/or devices in a conventional manner. The plurality of I/O pins 202 includes a supply voltage pin 212 for receiving a positive reference voltage (or supply voltage) and a ground voltage pin 214 for receiving a negative reference voltage (or ground voltage). In an exemplary embodiment, the supply voltage pin 212 is electrically connected to a conductive trace 216 (alternatively referred to herein as the external supply trace) formed on the semiconductor substrate 201 for transmitting and/or distributing the unregulated or external supply voltage (VDDe) to other I/O pins 202 and/or other components of the integrated circuit 200. In a similar manner, the ground voltage pin 214 is electrically connected to a conductive trace 218 (alternatively referred to herein as the external ground trace) formed on the semiconductor substrate 201 for transmitting the ground voltage (VSSe) to other I/O pins 202 (other than pin 212) and/or other components of the integrated circuit 200. As shown in FIG. 2, the external ground trace 218 roughly tracks the perimeter of the integrated circuit 200 creating a ground voltage power ring. The external supply trace 216 roughly tracks the inner periphery of the I/O pins 202 and forms a power ring that connects to the remaining I/O pins 202 (other than pin 214) for purposes of providing protection against electrostatic discharge (ESD) events, as will be appreciated in the art. As described in greater detail below, in an exemplary embodiment, the conductive traces 216, 218 function as sensing elements, wherein capacitive elements 220, 222 are coupled between the traces 216, 218 and the interference detection module 204 to create sensing arrangements for sensing interference signals over desired frequency bandwidths.

In an exemplary embodiment, the voltage pins 212, 214 and/or traces 216, 218 are coupled to the input of the voltage regulator 208 which produces a internal regulated supply voltage (VDDi) relative to a regulated ground voltage (VSSi) based on the external supply voltage (VDDe) and the external ground voltage (VSSe). The regulated supply voltage output of the voltage regulator 208 is electrically connected to a conductive trace 217 (alternatively referred to herein as the internal supply trace) formed on the semiconductor substrate 201 for transmitting and/or distributing the internal supply voltage (VDDi) to the processing system 206 and analog circuitry 210 and the regulated ground voltage output of the voltage regulator 208 is electrically connected to a conductive trace 219 (alternatively, the internal ground trace) formed on the semiconductor substrate 201 for transmitting and/or distributing the regulated ground voltage (VSSi) to the processing system 206 and analog circuitry 210. In an exemplary embodiment, the internal ground trace 219 is electrically connected to the ground voltage pin 214 and/or external ground trace 218 such that the internal ground voltage is equal to the external ground voltage (VSSi=VSSe).

In an exemplary embodiment, a first capacitive element 220 is provided between the external supply trace 216 and the interference detection module 204 to create a sensing arrangement for sensing radiated electromagnetic interference signals on the external supply trace 216. In this regard, the external supply trace 216 functions as an antenna, wherein an electromagnetic wave (or electromagnetic field) induces a voltage on the external supply trace 216 at the frequency of the electromagnetic wave. In an exemplary embodiment, the external supply trace 216 is tuned for a particular resonant frequency based on the length of the external supply trace 216. In this manner, the length and/or geometry of the external supply trace 216 may be chosen for a particular frequency of interest. In an exemplary embodiment, the length of the external supply trace 216 corresponds to at least one twentieth of the wavelength $$\left(\frac{\lambda}{20}\right)$$

of the resonant frequency of the anticipated electromagnetic interference on the external supply trace 216, however, other dimensions may be used $$\left(e.g., \frac{\lambda}{2}, \frac{5\lambda}{8}, \frac{\lambda}{4}, \frac{\lambda}{8}\right)$$

depending upon the available area within the integrated circuit 200. For example, in accordance with one embodiment, the external supply trace 216 has a length of about 4 millimeters and is configured to tune, sense, or otherwise receive interference signals with a frequency of about 10 GHz $$\left(e.g., \frac{\lambda}{8} \text{ ratio}\right)$$

The first capacitive element 220 is coupled between the external supply trace 216 and the interference detection module 204 and band-pass filters interference signals induced on the external supply trace 216. In accordance with one embodiment, the first capacitive element 220 is realized as a capacitor electrically connected between the external supply trace 216 and the interference detection module 204. In an exemplary embodiment, the capacitance of the first capacitive element 220 is chosen such that the frequency of a band-pass filter formed by the external supply trace 216 and the capacitive element 220 is tuned to a desired center frequency. In this regard, the center frequency of the band-pass filter is approximately equal to $$\frac{1}{\sqrt{LC}},$$

where L is the inductance of the conductive trace 216 and C is the capacitance of the capacitive element 220. In a similar manner, a second capacitive element 222 is provided between the external ground trace 218 and the interference detection module 204, and the second capacitive element 222 and external ground trace 218 are cooperatively configured to sense radiated electromagnetic interference signals with a desired frequency bandwidth. In some embodiments, the capacitive elements 220, 222 may be implemented by forming a layer of a dielectric material overlying a portion of the respective conductive trace 216, 218 and forming a layer of a conductive material overlying the dielectric material, wherein the conductive material is electrically connected to the interference detection module 204 and configured to provide a desired capacitance between the conductive trace 216, 218 and the interference detection module 204.

Figure 3:
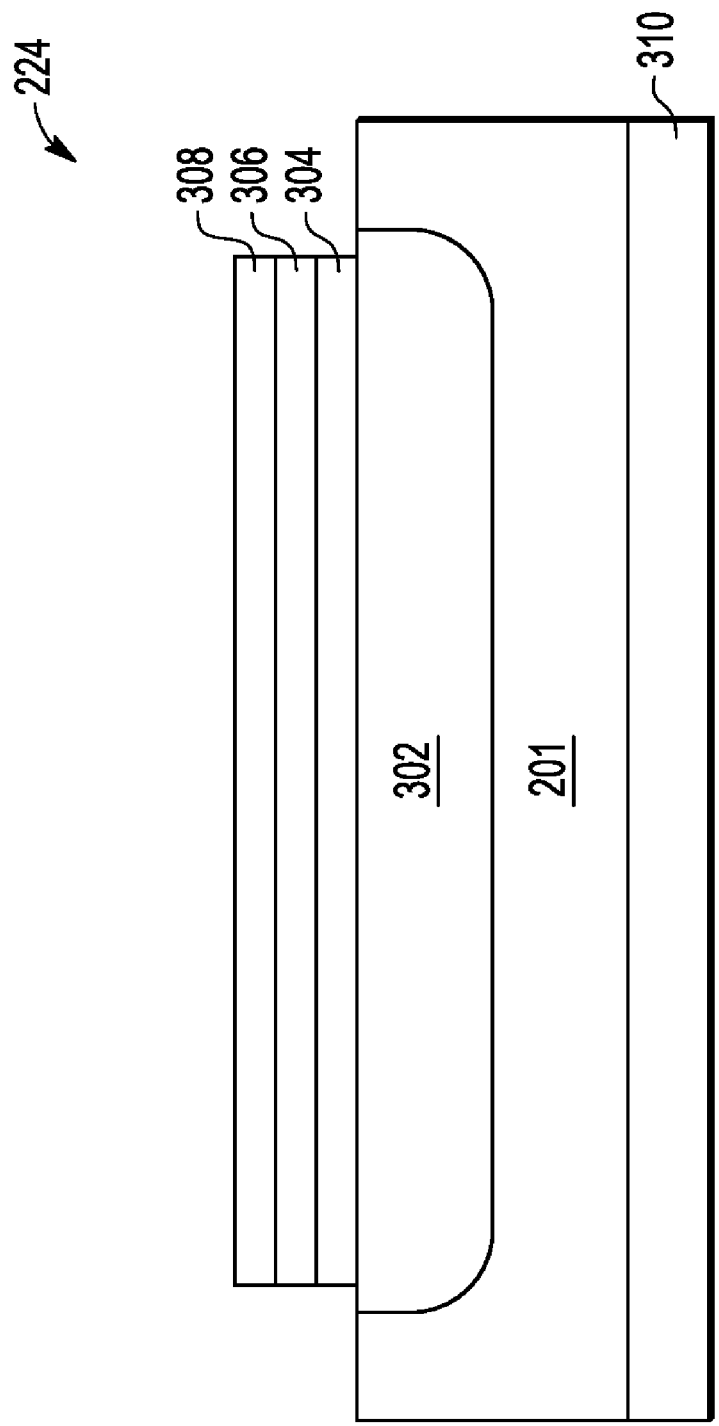
FIG. 3 is a cross-sectional view of a sensing arrangement for sensing interference signals conducted by a semiconductor substrate suitable for use with the integrated circuit of FIG. 2 along the line 3-3 in accordance with one embodiment of the invention.

As shown in FIG. 2, in an exemplary embodiment, a substrate sensing arrangement 224 is formed on the semiconductor substrate 201 for sensing conducted electromagnetic interference signals from the semiconductor substrate 201. FIG. 3 depicts a cross-sectional view of the substrate sensing arrangement 224. In an exemplary embodiment, the substrate sensing arrangement 224 comprises a contact region 302 formed in the semiconductor substrate 201, a first conductive structure 304 overlying the contact region 302, a layer of dielectric material 306 overlying the first conductive structure 304, and a second conductive structure 308 overlying the layer of dielectric material 306. In an exemplary embodiment, the semiconductor substrate 201 comprises semiconductor material, preferably silicon, however, in alternative embodiments, the semiconductor material may be realized as germanium, gallium arsenide, and the like, or silicon admixed with other elements such as germanium, carbon, and the like. The leadframe pad 310, also referred to as the flag or die pad, is conductive and may be utilized to sense electromagnetic interference signals, as described in greater detail below. In an exemplary embodiment, the leadframe pad 310 is realized as a thin conductive metal that is affixed to the substrate 201 using a conductive epoxy material.

In an exemplary embodiment, the contact region 302 comprises a heavily doped region of the semiconductor substrate 201 having the same conductivity-type as the semiconductor substrate 201. In this regard, the contact region 302 provides a low-resistive contact to the overlying conductive structure 304 to provide a strong electrical coupling between the semiconductor substrate 201 and the first conductive structure 304. In alternative embodiments, in addition to or in lieu of the contact region 302, the substrate sensing arrangement 224 may include one or more plugs or vias within the semiconductor substrate 201 that contact the first conductive structure 304 to provide a strong electrical coupling between the semiconductor substrate 201 and the first conductive structure 304. The first conductive structure 304 is preferably realized as a layer of a conductive metal, such as copper, formed and/or deposited overlying the semiconductor substrate 201 and in contact with the contact region 302. The layer of dielectric material 306 is preferably realized as an oxide material formed and/or deposited overlying the first conductive structure 304. The second conductive structure 308 is preferably realized as a layer of a conductive metal formed and/or deposited overlying the layer of dielectric material 306, however, in alternative embodiments, the second conductive structure 308 may be realized using polysilicon.

It should be appreciated that FIG. 3 is a simplified representation of the substrate sensing arrangement 224 for ease of explanation, and the shape and/or size of the substrate sensing arrangement 224 will vary depending on the particular embodiment. Accordingly, the substrate sensing arrangement 224 is not limited to any particular geometric arrangement. In alternative embodiments, the substrate sensing arrangement 224 may be implemented without the contact region 302 or other contacts (e.g., plugs or vias) and/or without the first conductive structure 304, however, in such embodiments, the electrical coupling between the first conductive structure 304 and the semiconductor substrate 201 will not be as strong. Furthermore, other alternative embodiments of the substrate sensing arrangement 224 may not include the first conductive structure 304.

Referring now to FIG. 2 and FIG. 3, in an exemplary embodiment, the upper conductive structure 308 of the substrate sensing arrangement 224 is electrically connected to the interference detection module 204. The resistance along with stray capacitances and inductances of the semiconductor substrate 201 create a resonant circuit at a particular resonant frequency, wherein the resonant frequency depends on the type of semiconductor material used, substrate doping, and the dimensions of the semiconductor substrate 201. For example, in many practical embodiments, the resonant frequency of the semiconductor substrate 201 will typically be between about 50 MHz and 300 MHz. In this manner, the semiconductor substrate 201 is utilized to sense conducted electromagnetic interference signals within a range of frequencies about the resonant frequency of the semiconductor substrate 201. In accordance with one embodiment, the semiconductor substrate 201 has a resonant frequency of about 100 MHz. An AC voltage conducted by the substrate 201 propagates via the contact region 302 to the first conductive structure 304, which is capacitively coupled to the interference detection module 204 by virtue of the layer of dielectric material 306 between the conductive structures 304, 308. In this regard, the substrate sensing arrangement 224 utilizes the substrate 201 as a sensing element and layers 304, 306, 308 as a capacitive element coupled to the interference detection module 204. The thickness of the layer of dielectric material 306 and the type of dielectric material used determines the capacitance between the substrate sensing element (e.g., first conductive structure 304) and the interference detection module 204. The layer of dielectric material 306 is preferably configured such that the capacitance between layers of conductive material 304, 308 provides a band-pass filter having a desired center frequency and/or bandwidth, in a similar manner as described above.

Figure 4:
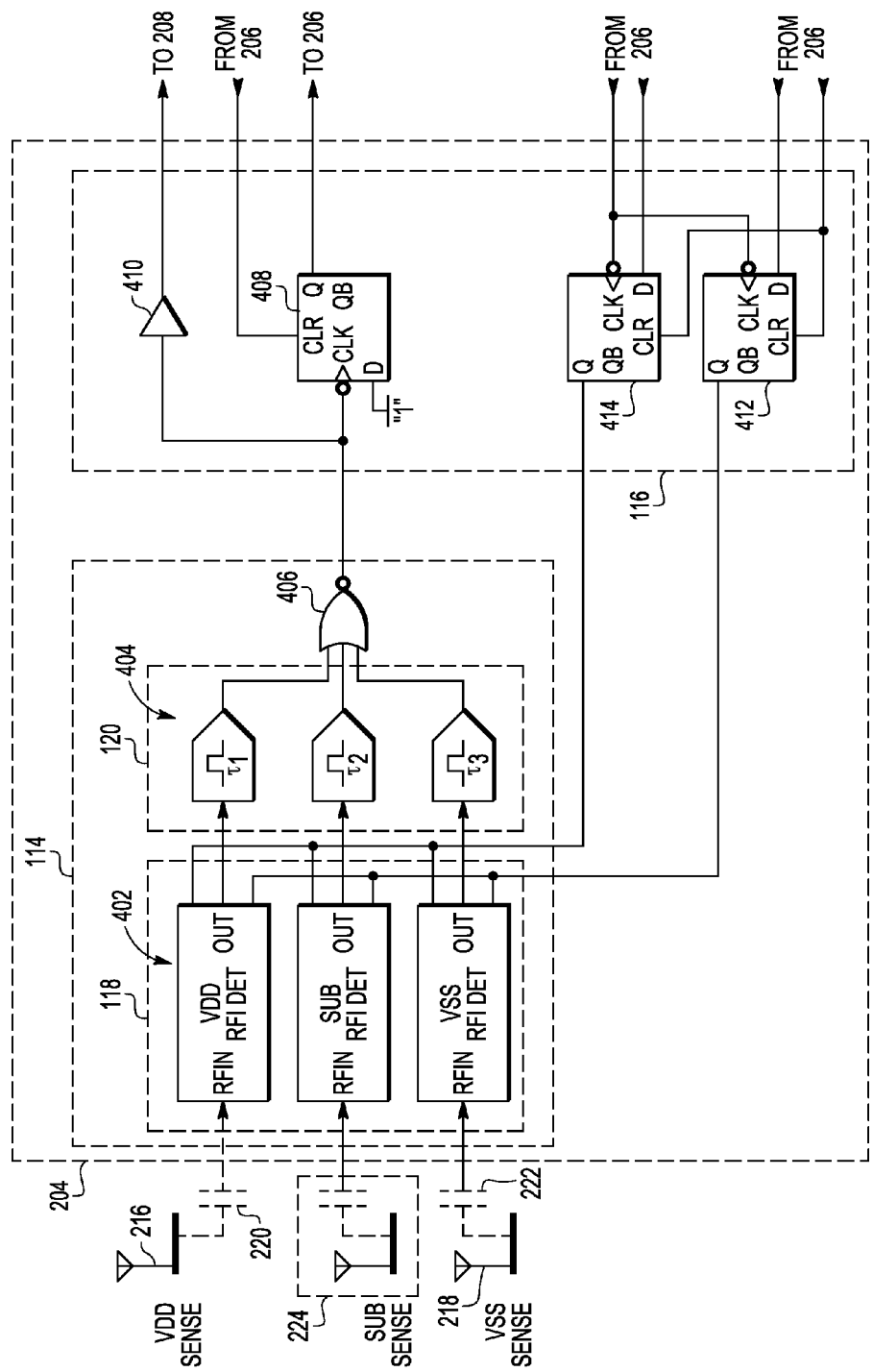
FIG. 4 is a block diagram of an interference detection module suitable for use with the integrated circuit of FIG. 2 in accordance with one embodiment of the invention.

FIG. 4 depicts an exemplary embodiment of the interference detection module 204 of FIG. 2. As shown, the interference detection module 204 includes comparison circuitry 118 that includes a plurality of comparison arrangements 402, with each comparison arrangement 402 being associated with a particular sensing arrangement. The filtering arrangement 120 includes a plurality of deglitchers 404, with each deglitcher 404 being associated with a respective comparison arrangement 402. The output of the deglitchers 404 is provided to logical NOR circuitry 406 (or NOR gate). As described above, each comparison arrangement 402 is configured to determine whether a power level of an interference signal sensed by its respective sensing arrangement is greater than a threshold value by rectifying and/or demodulating the sensed interference signal from its respective sensing arrangement and comparing the average power of the sensed interference signal to the threshold value. When the average power of the sensed interference signal is greater than the threshold value, the output of the comparison arrangement 402 becomes logical high (or logical '1'). The deglitcher 404 associated with the comparison arrangement 402 filters the output of the comparison arrangement 402 such that the output of the deglitcher 404 is logical high only when the average power of the sensed interference signal is greater than the threshold value for a predetermined amount of time. When the output of one or more of the deglitchers 404 is logical high, the output of the NOR circuitry 406 becomes logical low (or logical '0').

As shown in FIG. 4, in accordance with one or more embodiments, the interrupt control logic 116 includes a flip-flop 408 (or another latching arrangement) that is clocked (or latched) in response to a logical low. As shown, the data input of the flip-flop 408 is a logical '1', causing the output of the flip-flop 408 to become a logical high (or logical '1') when the output of the NOR circuitry 406 is logical low. The output of the flip-flop 408 comprises an interrupt signal which is provided to the processing system 206 to indicate an interference event (or alternatively, the processing system 206 periodically monitors the output of the flip-flop 408 for an interference event). The interrupt control logic 116 also includes a level shifter 410 that is coupled to the voltage regulator 208 and configured to increase the bias point of the voltage regulator 208 in response to a logical low.

Referring again to FIG. 2, alternate embodiments of the integrated circuit 200 may employ additional sensing arrangements to sense radiated electromagnetic interference at different locations of the integrated circuit 200 or over different frequency bandwidths. For example, in accordance with one embodiment, another capacitive element may be provided between the leadframe pad of the integrated circuit 200 and the interference detection module 204 to create a sensing arrangement for sensing radiated electromagnetic interference signals induced in the leadframe pad (e.g., leadframe pad 310) of the integrated circuit 112, 200. In this regard, the leadframe pad functions as an antenna, wherein an electromagnetic wave induces an AC voltage in the leadframe pad at the frequency of the electromagnetic wave. The resonant frequency of the leadframe pad will vary depending on the type of conductive material used and the dimensions of the leadframe pad, and will typically be about 100 MHz. A capacitive element may be provided between the leadframe pad and the interference detection module 204 and configured as a band-pass filter, in a similar manner as described above. In another embodiment, a capacitive element may be provided between an I/O pin 202 and the interference detection module 204 to create a sensing arrangement for sensing conducted electromagnetic interference signals from the respective I/O pin 202. For example, a capacitive element may be provided between the supply voltage pin 212 (or ground voltage pin 214) and the interference detection module 204 to sense conducted interference signals from an external power source. Similarly, in other embodiments, a capacitive element may be provided between the interference detection module 204 and another location within the integrated circuit 200 known to be a source of conducted interference (e.g., an interference hotspot). It should be appreciated that any number of sensing arrangements may be utilized in a practical embodiment of the integrated circuit 200.

Figure 5:
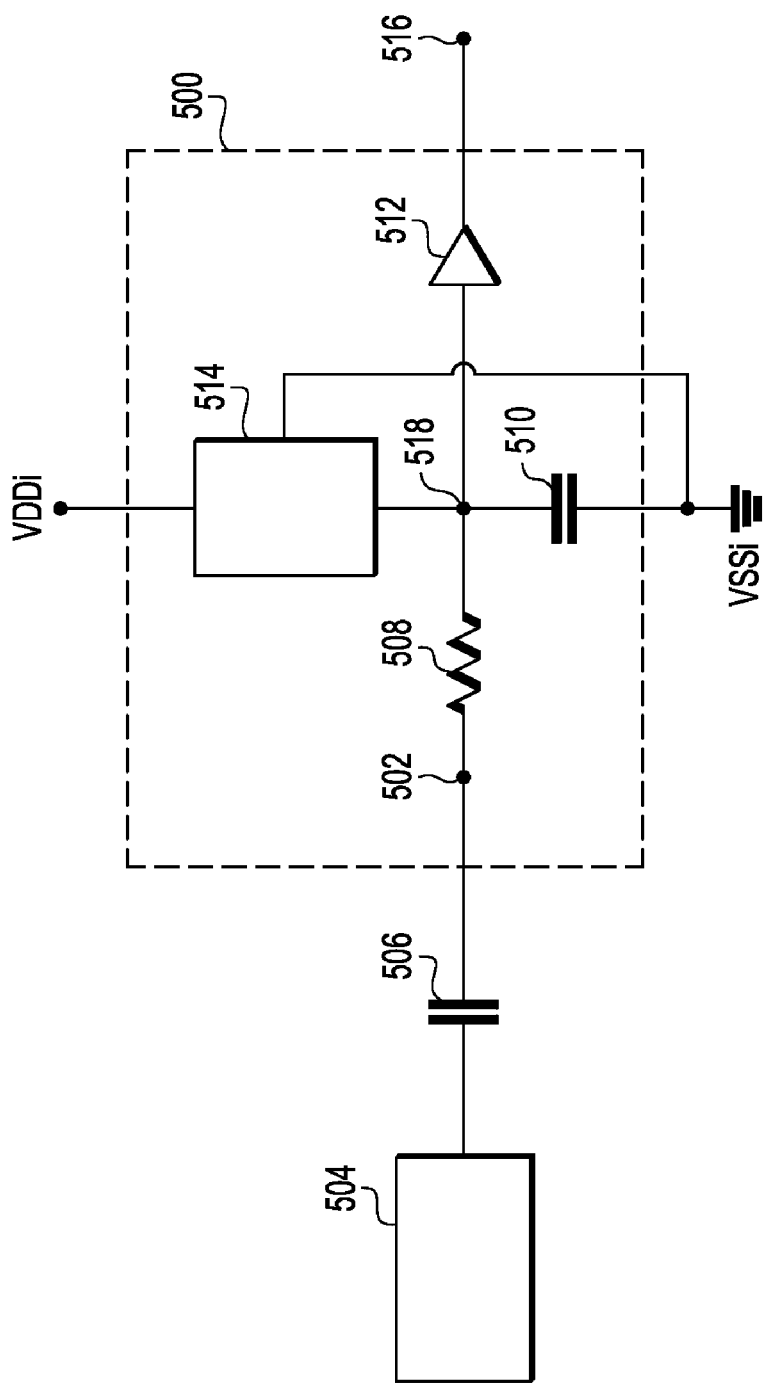
FIG. 5 is a schematic view of a comparison arrangement suitable for use with the interference protection system of FIG. 1 in accordance with one embodiment of the invention.

FIG. 5 depicts a schematic view of a comparison arrangement 500 suitable for use as the comparison circuitry 118 in the interference protection system 100 of FIG. 1. An input node 502 of the comparison arrangement 500 is coupled to a sensing arrangement comprising a sensing element 504 (e.g., a conductive trace 216, 218 or substrate 201) and a capacitive element 506 (e.g., a capacitive element 220, 222 or layers 304, 306, 308). The illustrated embodiment of the comparison arrangement 500 includes, without limitation, a resistive element 508, a capacitive element 510, comparator circuitry 512, and biasing circuitry 514. It should be appreciated that FIG. 5 is a simplified representation of a comparison arrangement 500 for purposes of explanation and ease of description and is not intended to limit the subject matter in any way.

In an exemplary embodiment, the resistive element 508 comprises a resistor or another suitable resistance element coupled between the input node 502 and node 518. The capacitive element 510 comprises a capacitor or another suitable capacitance element coupled between node 518 and ground (e.g., conductive trace 219). The comparator circuitry 512 is configured to change the voltage of the output node 516 (e.g., from a logical high to a logical low or vice versa) when the voltage at node 518 crosses a particular threshold voltage of the comparator circuitry 512, as will be appreciated in the art. In an exemplary embodiment, the biasing circuitry 514 is configured to bias the voltage at node 518 to a particular voltage level relative to the threshold voltage of the comparator circuitry 512, such that when the power level of an electromagnetic signal sensed by the sensing element 504 is greater than or equal to a threshold value corresponding to an interference event, the voltage at node 518 changes in a corresponding manner, which in turn, causes the output of the comparator circuitry 512 and/or comparison arrangement 500 to change to indicate an interference event. In this regard, the resistive element 508 and the capacitive element 510 are cooperatively configured as a low-pass filter, such that an increase in the power level of electromagnetic interference over the frequencies that are sensed and/or tuned by sensing element 504 and capacitive element 506 causes the voltage at node 518 to increase above (or in alternative embodiments, decrease below) a threshold value of the comparator circuitry 512 and causes the voltage at the output of the comparator circuitry 512 (i.e., output node 516) to change to a different logic level, thereby indicating an interference event.

Referring now to FIG. 6, in an exemplary embodiment, an interference protection system may be configured to perform an interference detection process 600 and additional tasks, functions, and/or operations as described below. The various tasks may be performed by software, hardware, firmware, or any combination thereof. For illustrative purposes, the following description may refer to elements mentioned above in connection with FIGS. 1-5. In practice, the tasks, functions, and operations may be performed by different elements of the described system, such as the sensing arrangement 102, interference detection module 104, 204 the processing system 106, 206, the voltage regulator 108, 208, the interference detection circuitry 114 and/or the interrupt control logic 116. It should be appreciated any number of additional or alternative tasks may be included, and may be incorporated into a more comprehensive procedure or process having additional functionality not described in detail herein.

Referring now to FIG. 6, and with continued reference to FIGS. 1-5, an interference detection process 600 may be performed to protect a processing system, such as a processing system 106, 206 of an integrated circuit 112, 200, from electromagnetic interference. In an exemplary embodiment, the interference detection process 600 begins by sensing or otherwise obtaining an electromagnetic interference signal and determining a power (or energy) level associated with the sensed interference signal (tasks 602, 604). In this regard, a sensing arrangement 102 senses electromagnetic interference which is provided to the interference detection module 104 as an AC voltage. For example, a radiating electromagnetic wave (or field) induces an AC voltage on the external supply trace 216 which is filtered by capacitive element 220 and provided to the interference detection module 104, 204. In an exemplary embodiment, the interference detection circuitry 114 determines the average power of the sensed interference signal by rectifying and/or demodulating the sensed interference signal.

In an exemplary embodiment, the interference detection process 600 continues by detecting or otherwise identifying an electromagnetic interference event based on the power level associated with the sensed interference signal (task 606). As described above, an electromagnetic interference event occurs when a power level associated with an electromagnetic interference signal exceeds a threshold value for a predetermined amount of time. In an exemplary embodiment, the comparison circuitry 118 compares the average power of the sensed interference signal to a threshold value to determine whether the average power of the sensed interference signal exceeds the threshold value. The filtering arrangement 120 determines whether the average power of the sensed interference signal exceeds the threshold value for the predetermined amount of time, such that the output of the interference detection circuitry 114 is a logical high (e.g., logical '1') when the average power of the sensed interference signal exceeds the threshold value for the predetermined amount of time. In this manner, the interference detection module 104, 204 detects an electromagnetic interference event by determining a power level of the sensed interference signal exceeds a threshold value for a predetermined amount of time. Thus, it may be possible for a spurious or transient interference signal to exceed the threshold value for a brief period time without necessitating remedial measures, wherein the loop defined by tasks 602, 604, and 606 may repeat throughout operation of the interference protection system 100. It should be appreciated that the threshold value and the predetermined amount of time may vary depending on the particular bandwidth of interference signals, such that interference detection circuitry 114 may be configured with different comparison arrangements and/or filtering arrangements for each respective sensing arrangement 102.

In an exemplary embodiment, in response to an electromagnetic interference event, the interference detection process 600 continues by generating an interrupt signal (or interrupt request) for the processing system (task 608). In an exemplary embodiment, the interrupt control logic 116 generates an interrupt signal which is provided to the processing system 106, 206. As set forth above, in an exemplary embodiment, the interrupt signal comprises a digital signal or code, wherein one or more bits of the digital signal identify the interrupt signal as being attributable to an electromagnetic interference event. Additionally, depending on the embodiment, the interrupt signal may identify the particular source of the electromagnetic interference event, for example, by identifying the sensing arrangement 102 from which the interference signal was sensed or detected.

In an exemplary embodiment, the interference detection process 600 continues by adjusting the bias point of the analog circuitry in response to the electromagnetic interference event (task 610). In accordance with one embodiment, the interrupt control logic 116 and/or interference detection module 104, 204 may signal or command the voltage regulator 108, 208 to increase the bias point of the analog circuitry 110, 210. In alternative embodiments, the processing system 106, 206 may signal or command the voltage regulator 108, 208 to increase the bias point of the analog circuitry 110, 210 in response to the interrupt signal or the voltage regulator 108, 208 may be configured to automatically increase the bias point in response to the interrupt signal. In an exemplary embodiment, the voltage regulator 108, 208 increases the bias point of the analog circuitry 110, 210 by increasing the value of the reference current used by the analog circuitry 110, 210 to establish the bias point, as described above. The reference current (or bias point) is increased by an amount that will allow the analog circuitry 110, 210 to maintain normal operation in the presence of the electromagnetic interference event. For example, the reference current may be increased proportionally to the magnitude of the sensed interference signal (e.g., by multiplying the reference current by the ratio of the average power of the sensed interference signal to the threshold value), or alternatively, by some other fixed amount (e.g., twice the default or normal reference current). As set forth above, increasing the reference current increases the bias current (or bias point) of the analog circuitry 110, 210 by a corresponding amount. By increasing the bias point of the analog circuitry 110, 210, the integrated circuit 112, 200 and/or interference protection system 100 may maintain normal operation and reduces the likelihood of errors in the presence of electromagnetic interference or otherwise noisy operating environments. For example, if the analog circuitry 110, 210 comprises an oscillator and/or PLL for the processing system 106, 206, increasing the bias point of the oscillator and/or PLL helps maintain clock synchronization for the processing system 106, 206 and/or interference protection system 100. In some embodiments, the voltage regulator 108, 208 may be configured to increase the bias point of the analog circuitry 110, 210 for a certain amount of time before returning to the initial bias point. In alternative embodiments, the voltage regulator 108, 208 and/or interference detection module 104, 204 may be configured such that the voltage regulator 108, 208 increases the bias point for as long as a sensed interference signal exceeds its respective threshold value.

In an exemplary embodiment, the interference detection process 600 continues by responding to the generated interrupt signal by taking remedial action and determining whether to shut down (tasks 612, 614). In this regard, in response to receiving an interrupt signal from the interference detection module 104, 204, the processing system 106, 206 may execute one or more procedures to save (or store) unsaved data in non-volatile memory, for example, data stored in volatile memory or other sensitive data at risk of being lost, or take other remedial actions, such as, performing additional signal processing to reduce errors (while potentially sacrificing some performance metrics). In some embodiments, the processing system 106, 206 may shut down or power off after taking remedial actions to prevent the processing system 106, 206 from crashing. As shown in FIG. 4, after receiving the interrupt signal, the processing system 206 may provide a signal to the interrupt control logic 116 to clear the interrupt signal line by resetting flip-flop 408.

In an exemplary embodiment, the interference detection process 600 is configured for multiple interference events and/or interference levels, wherein in response to a first electromagnetic interference event, after taking remedial actions, the interference detection process 600 continues by increasing the threshold value(s) for detecting an electromagnetic interference event (task 616). In this regard, the interrupt control logic 116 may automatically increase or otherwise adjust the threshold value(s) used by the comparison circuitry 118, such that a subsequently generated interrupt signal corresponds to a sensed interference signal with a greater power level than that of the preceding electromagnetic interference event. Alternatively, as shown in FIG. 4, the processing system 206 may provide signals to one or more flip-flops 412, 414 of the interrupt control logic 116 which, in turn, increases or otherwise adjusts the threshold value(s) used by the comparison arrangements 402 (e.g., by adjusting the bias voltage at node 518 via biasing circuitry 514). In this manner, the interference protection system 100 may continue operating in a noisy environment in the presence of moderate electromagnetic interference until sensing an interference signal that exceeds the second (or upper) threshold value (tasks 602, 604, 606). In response to a second electromagnetic interference event, that is, a sensed interference signal with an average power exceeding the upper threshold value for the predetermined amount of time, the interference detection process 600 continues by generating another interrupt signal (tasks 606, 608). In this regard, the second interrupt signal may be modified and/or generated by the interrupt control logic 116 in a manner that indicates to the processing system 106, 206 that the upper threshold value has been exceeded. In response to the second interrupt signal, the voltage regulator 108, 208 may further increase the bias point provided the increased bias point is within the acceptable operating ranges for the analog circuitry 110, 210. This allows the interference protection system 100 and/or analog circuitry 110, 210 to maintain normal operation while the processing system 106, 206 takes any remedial actions prior to shutting down (tasks 610, 612, 614). It should be appreciated that the interference detection process 600 and/or interference protection system 100 may be adapted for any number of interference thresholds and is not limited to only a lower threshold value and an upper threshold value.

One advantage of the systems described above is that an interference event can be quickly and reliably identified, allowing the processing system within the integrated circuit to take remedial actions before the operation of the processing system is compromised. The bias for analog circuitry within the integrated circuit may be increased in response to an interference event, allowing the integrated circuit to maintain normal operation with reduced likelihood of errors in noisy operating environments. Additionally, the integrated circuit may include any number of sensing arrangements, which may be adapted for various forms of interference (e.g., conducted and/or radiated) and for particular frequencies of interest (e.g., frequencies the integrated circuit is susceptible to).

Systems, devices, and methods configured in accordance with example embodiments of the invention relate to:

In accordance with one embodiment, an apparatus is provided for an integrated circuit. The integrated circuit comprises a sensing arrangement configured to sense an interference signal and an interference detection module coupled to the sensing arrangement. The interference detection module is configured to detect when a power level associated with the interference signal is greater than a first threshold value. In accordance with one embodiment, the sensing arrangement comprises a sensing element sensitive to electromagnetic interference and a capacitive element coupled between the sensing element and the interference detection module. In a further embodiment, the sensing element comprises a conductive trace. In another embodiment, the integrated circuit comprises a plurality of pins for interfacing with the integrated circuit, wherein the sensing element comprises a first pin of the plurality of pins. In accordance with another embodiment, the integrated circuit further comprises a semiconductor substrate, wherein the sensing arrangement and the interference detection module are formed on the semiconductor substrate and encapsulated in a single device package. In a further embodiment, the sensing arrangement comprises a first conductive structure overlying the semiconductor substrate and coupled to the interference detection module. In a further embodiment, the sensing arrangement further comprises a dielectric material overlying the semiconductor substrate, wherein the first conductive structure overlies the dielectric material. In accordance with another embodiment, a leadframe pad is affixed to a surface of the semiconductor substrate, wherein the sensing arrangement comprises a capacitive element coupled between the leadframe pad and the interference detection module. In accordance with one embodiment, interference detection module comprises comparison circuitry and a filtering arrangement. The comparison circuitry is coupled to the sensing arrangement and configured to detect when the power level associated with the interference signal is greater than the first threshold value. The filtering arrangement is coupled to the comparison circuitry and configured to indicate when the power level associated with the interference signal is greater than the first threshold value for a predetermined amount of time. In yet another embodiment, the integrated circuit comprises analog circuitry having a bias point controlling an operating characteristic of the analog circuitry and a voltage regulator coupled to the analog circuitry and the interference detection module, wherein the voltage regulator is configured to adjust the bias point of the analog circuitry when the detected power level of the interference signal is greater than the first threshold value. In accordance with another embodiment, the integrated circuit further comprises a processing system coupled to the interference detection module, wherein the interference detection module is configured to generate an interrupt for the processing system when the power level associated with the interference signal is greater than the first threshold value, and the processing system is configured to take remedial action in response to the interrupt.

In accordance with another embodiment, a method is provided for providing protection from electromagnetic interference in an integrated circuit. The method comprises sensing electromagnetic interference within the integrated circuit, resulting in a sensed interference signal, detecting an interference event based on a power level associated with the sensed interference signal, and taking remedial action in response to the interference event. In a further embodiment, detecting the interference event comprises comparing the power level of the sensed interference signal to a first threshold value and identifying the interference event when the power level exceeds the first threshold value. In accordance with one embodiment, the method further comprises sensing a second electromagnetic interference signal within the integrated circuit, resulting in a second sensed interference signal, determining a second power level associated with the second sensed interference signal, comparing the second power level of the second sensed interference signal to a second threshold value, the second threshold value being greater than the first threshold value, and identifying a second interference event when the second power level exceeds the second threshold value. In another embodiment, the integrated circuit includes analog circuitry, wherein taking remedial action comprises adjusting a bias point of the analog circuitry in response to the interference event. In accordance with yet another embodiment, the method further comprises generating a first interrupt for a processing system of the integrated circuit in response to the interference event, wherein the processing system is configured to take remedial action in response to the first interrupt.

In accordance with another embodiment, an interference protection system for use with an integrated circuit package is provided. The interference protection system comprises a sensing arrangement configured to obtain an interference signal in response to electromagnetic interference within the integrated circuit package and an interference detection module coupled to the sensing arrangement. The interference detection module is configured to identify an interference event based on the interference signal and indicate the interference event. In accordance with one embodiment, the interference protection system further comprises a processing system contained in the integrated circuit package. The interference detection module is coupled to the processing system and configured to generate an interrupt signal for the processing system in response to the interference event, and the processing system is configured to take remedial action in response to the interrupt signal. In accordance with another embodiment, the interference protection system further comprises a semiconductor substrate, wherein the sensing arrangement comprises a conductive trace formed on the semiconductor substrate and a capacitive element coupled between the conductive trace and the interference detection module. In accordance with yet another embodiment, the interference protection system further comprises a semiconductor substrate, wherein the sensing arrangement comprises a first conductive material overlying the semiconductor substrate, wherein the first conductive material and the semiconductor substrate are electrically connected, a dielectric material overlying the first conductive material, and a second conductive material overlying the dielectric material, wherein the second conductive material is coupled to the interference detection module.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An integrated circuit comprising:
   a sensing arrangement configured to sense an electromagnetic interference signal;
   an interference detection module capacitively coupled to the sensing arrangement, wherein the interference detection module is configured to detect when a power level associated with the electromagnetic interference signal is greater than a first threshold value; and
   a semiconductor substrate, wherein the sensing arrangement and the interference detection module are formed on the semiconductor substrate and encapsulated in a single device package.

2. The integrated circuit of claim 1, wherein the sensing arrangement comprises:
   a sensing element; and
   a capacitive element coupled between the sensing element and the interference detection module.

3. The integrated circuit of claim 2, wherein the sensing element comprises a conductive trace.

4. The integrated circuit of claim 2, further comprising a plurality of pins for interfacing with the integrated circuit, wherein the sensing element comprises a first pin of the plurality of pins.

5. The integrated circuit of claim 2, wherein the sensing element is sensitive to electromagnetic interference.

6. The integrated circuit of claim 1, wherein the sensing arrangement comprises a first conductive structure overlying the semiconductor substrate and coupled to the interference detection module.

7. The integrated circuit of claim 6, wherein the sensing arrangement further comprises a dielectric material overlying the semiconductor substrate, wherein the first conductive structure overlies the dielectric material.

8. The integrated circuit of claim 1, further comprising a leadframe pad affixed to a surface of the semiconductor substrate, wherein the sensing arrangement comprises a capacitive element coupled between the leadframe pad and the interference detection module.

9. An integrated circuit comprising:
a sensing arrangement configured to sense an electromagnetic interference signal; and
an interference detection module coupled to the sensing arrangement, wherein the interference detection module is configured to detect when a power level associated with the electromagnetic interference signal is greater than a first threshold value, wherein the interference detection module comprises:
comparison circuitry coupled to the sensing arrangement, the comparison circuitry being configured to detect when the power level associated with the electromagnetic interference signal is greater than the first threshold value; and
a filtering arrangement coupled to the comparison circuitry, the filtering arrangement being configured to indicate when the power level associated with the electromagnetic interference signal is greater than the first threshold value for a predetermined amount of time.

10. An integrated circuit comprising:
a sensing arrangement configured to sense an electromagnetic interference signal;
an interference detection module coupled to the sensing arrangement, wherein the interference detection module is configured to detect when a power level associated with the electromagnetic interference signal is greater than a first threshold value;
analog circuitry having a bias point, the bias point controlling an operating characteristic of the analog circuitry; and
a voltage regulator coupled to the analog circuitry and the interference detection module, wherein the voltage regulator is configured to adjust the bias point of the analog circuitry when the detected power level of the electromagnetic interference signal is greater than the first threshold value.

11. An integrated circuit comprising:
a sensing arrangement configured to sense an electromagnetic interference signal;
an interference detection module coupled to the sensing arrangement, wherein the interference detection module is configured to detect when a power level associated with the electromagnetic interference signal is greater than a first threshold value; and
a processing system coupled to the interference detection module, wherein:
the interference detection module is configured to generate an interrupt for the processing system when the power level associated with the electromagnetic interference signal is greater than the first threshold value; and
the processing system is configured to take remedial action in response to the interrupt.

12. A method for providing protection from electromagnetic interference in an integrated circuit, the method comprising:
sensing electromagnetic interference within the integrated circuit, resulting in a sensed electromagnetic interference signal;
detecting an interference event based on a power level associated with the sensed electromagnetic interference signal by:
comparing the power level of the sensed electromagnetic interference signal to a first threshold value, and
identifying the interference event when the power level exceeds the first threshold value; and
taking remedial action in response to the interference event.

13. The method of claim 12, further comprising:
sensing a second electromagnetic interference signal within the integrated circuit, resulting in a second sensed electromagnetic interference signal;
determining a second power level associated with the second sensed electromagnetic interference signal;
comparing the second power level of the second sensed electromagnetic interference signal to a second threshold value, the second threshold value being greater than the first threshold value; and
identifying a second interference event when the second power level exceeds the second threshold value.

14. The method of claim 12, the integrated circuit including analog circuitry, wherein taking remedial action comprises adjusting a bias point of the analog circuitry in response to the interference event.

15. The method of claim 12, further comprising generating a first interrupt for a processing system of the integrated circuit in response to the interference event, wherein the processing system is configured to take remedial action in response to the first interrupt.

16. An interference protection system for use with an integrated circuit package, the interference protection system comprising:
a processing system contained in the integrated circuit package;
a sensing arrangement configured to obtain an interference signal in response to electromagnetic interference within the integrated circuit package; and
an interference detection module coupled to the sensing arrangement and the processing system, wherein the interference detection module is configured to:
identify an interference event based on the interference signal; and
generate an interrupt signal for the processing system in response to the interference event, the processing system being configured to take remedial action in response to the interrupt signal.

17. The interference protection system of claim 16, further comprising a semiconductor substrate, wherein the sensing arrangement comprises:
a conductive trace formed on the semiconductor substrate; and
a capacitive element coupled between the conductive trace and the interference detection module.

18. The interference protection system of claim 16, further comprising a semiconductor substrate, wherein the sensing arrangement comprises:

a first conductive material overlying the semiconductor substrate, wherein the first conductive material and the semiconductor substrate are electrically connected;

a dielectric material overlying the first conductive material; and a second conductive material overlying the dielectric material, wherein the second conductive material is coupled to the interference detection module.

19. An integrated circuit comprising:

a processing system;

a sensing arrangement configured to sense an interference signal; and an interference detection module coupled to the sensing arrangement and the processing system, wherein:

the interference detection module is configured to:

detect when a power level associated with the interference signal is greater than a first threshold value; and generate an interrupt for the processing system when the power level associated with the interference signal is greater than the first threshold value; and the processing system is configured to take remedial action in response to the interrupt.

\* \* \* \* \*